(12) United States Patent
Motsiff et al.

(10) Patent No.: US 6,798,066 B1
(45) Date of Patent: Sep. 28, 2004

(54) HEAT DISSIPATION FROM IC INTERCONNECTS

(75) Inventors: William T. Motsiff, Essex Junction, VT (US); Timothy D. Sullivan, Underhill, VT (US); Jean E. Wynne, Fair Haven, VT (US); Sally J. Yankee, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,910

(22) Filed: May 16, 2003

(51) Int. Cl.[7] .......................... H01L 23/48; H01L 23/52; H01L 29/40
(52) U.S. Cl. .................... 257/758; 257/173; 257/355
(58) Field of Search .............................. 257/758, 173, 257/355

(56) References Cited

U.S. PATENT DOCUMENTS 5,623,387 A * 4/1997 Li et al. ..................... 361/56
6,259,139 B1 * 7/2001 Pan ............................. 257/355

* cited by examiner

Primary Examiner—David Nelms
Assistant Examiner—Tu-Tu Ho
(74) Attorney, Agent, or Firm—William D. Sabo (57) ABSTRACT

The present invention relates to dissipating heat from an interconnect formed in a low thermal conductivity dielectric in an integrated circuit apparatus. The integrated circuit apparatus includes integrated circuit devices interconnected by conductive interconnection metallurgy and input/output pads subject to electrostatic discharge events. At least one latent heat of transformation absorber is associated with at least one of the input/output pads for preventing the energy generated by an electrostatic discharge event from damaging the conductive interconnection metallurgy.

24 Claims, 6 Drawing Sheets

HEAT DISSIPATION FROM IC INTERCONNECTS

BACKGROUND OF INVENTION

Field of the Invention

The field of the present invention is semiconductor integrated circuits. More specifically, the present invention relates to dissipating heat in semiconductor integrated circuits.

Integrated circuits formed on a semiconductor substrate such as, for example, silicon, silicon-on-insulator (SOI), or silicon germanium (SiGe), include devices such as transistors, capacitors, resistors and inductors which are connected by interconnects (e.g. wires). Interconnects are typically located in Back-End-of-Line (BEOL) levels above the Front-End-of-Line (FEOL) devices of the integrated circuit. Interconnects and vias provide an electrical path between devices within an integrated circuit so that desired electrical connections are formed between devices. Interconnects can also provide electrical connection from devices to input/output pads for connection to an external signal (i.e. power supply, ground, or signal line). Since interconnects are used to provide electrical connection, interconnects are typically formed of an electrically conductive material such as, for example, a metal. Metals such as, for example, aluminum or copper are commonly used due to their relatively low electrical resistance.

Forming conductive interconnects and vias on a semiconductor substrate can be achieved by a variety of methods. For example, damascene and dual damascene processes can be used to form interconnects and vias. For a given wiring level, a dielectric layer is deposited, patterned and etched to form a trough for interconnects (i.e. damascene process) or interconnects and vias (i.e. dual damascene process). Metal is deposited to fill the trough and any metal overlying the dielectric layer is removed typically by a chemical mechanical polish (CMP). The dielectric layer electrically isolates interconnects from each other. In addition, as heat is generated due to electrical current flowing through an interconnect, the dielectric layer provides a thermal conduction path so that heat can be dissipated away from the interconnect.

In order to increase the speed of integrated circuits, the size of devices and interconnects that form integrated circuits must be reduced. Two effects limiting the speed of integrated circuits are the electrical resistance of the interconnect (i.e. line resistance) and resistive-capacitive (RC) coupling induced time delay due to higher wiring density and closer spacing of interconnects. As the distance between adjacent interconnects decreases, RC coupling between adjacent interconnects increases. To reduce line resistance, aluminum interconnects are being replaced with copper interconnects since copper has a lower electrical resistance than aluminum. RC coupling induced time delay is being addressed by the use of low dielectric constant (low-k) dielectrics such as, for example, polyimide nanofoams (also known by tradenames such as, for example, SiLK which is manufactured by Dow Chemical Co., Midland, Mich.), to replace conventional dielectrics (i.e. silicon oxide). By utilizing a low-k dielectric, the capacitance between adjacent interconnects is reduced, thus reducing the RC coupling induced time delay.

Due to lower electrical interconnect resistance and lower RC coupling induced time delay afforded by the use of copper interconnects and low-k dielectrics, increased current flow can be applied to the interconnects in order to provide higher performance integrated circuits (i.e. higher operating frequency). Also, interconnects are exposed to undesirable current flow such as high current, short time duration pulses caused by, for example, an electrostatic discharge (ESD) event or a power up/down event. High current flow through an interconnect results in the generation of a large amount of heat which must be effectively dissipated.

The combination of copper interconnects with a low-k dielectric creates a thermal dissipation problem in an integrated circuit. Low-k dielectrics characteristically do not provide heat dissipation as well as silicon oxide dielectrics. Additionally, some low-k dielectrics, especially types formed of organic foams, will degrade both structurally and electrically at temperatures exceeding about 350° C. If heat is not adequately dissipated from the interconnect, the temperature of the interconnect increases and the electrical resistance of the interconnect also increases, thus degrading the performance of the integrated circuit. If enough heat is generated, the interconnect can melt leading to reliability issues and/or failure of the interconnect. The migration of interconnects from aluminum to copper has improved the thermal robustness of interconnects since the melting temperature of copper is higher than aluminum. However, continued scaling of copper interconnects to smaller dimensions to meet increased integrated circuit requirements will expose copper interconnects to temperatures that exceed the melting temperature of copper.

Dissipating heat from an interconnect formed in a low thermal conductivity dielectric is desired.

SUMMARY OF INVENTION

It is thus an object of the present invention to dissipate heat from an interconnect formed in a low thermal conductivity dielectric.

The foregoing and other objects of the invention are realized, in a first aspect, by an integrated circuit apparatus including integrated circuit devices interconnected by conductive interconnection metallurgy and input/output pads subject to electrostatic discharge events. At least one latent heat of transformation absorber is associated with at least one of the input/output pads for preventing the energy generated by an electrostatic discharge event from damaging the conductive interconnection metallurgy.

BRIEF DESCRIPTION OF DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION

The present invention describes integrating a latent heat of transformation absorber in the BEOL metallurgy of an integrated circuit. For BEOL metallurgy including, for example, copper interconnects and low-k inter-level dielectrics, a primary function of the latent heat of transformation absorber is to remove heat away from copper interconnects and to dissipate it more efficiently than the low-k dielectric surroundings. The latent heat of transformation absorber takes advantage of the constant temperature that is maintained as a material undergoes a phase change such as, for example, from solid to liquid phase. Thus, additional heat from a copper interconnect can be absorbed resulting in increased heat dissipation away from the interconnect. The latent heat of transformation absorber includes a heat transient layer having a high thermal conductivity and a lower melting point temperature than the melting point temperature of the interconnect. The heat transient layer can be formed from a material such as, for example aluminum, tin or lead or their alloys for integration into copper BEOL metallurgy.

Figure 1A:
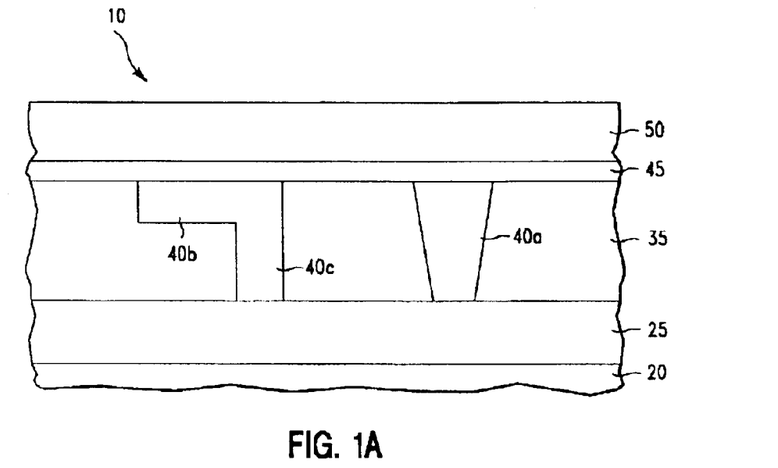
FIGS. 1A–E show the formation of a latent heat of transformation absorber according to a first embodiment of the present invention.

According to a first embodiment of the present invention, FIG. 1A shows integrated circuit 10 formed on substrate 20 such as, for example, a silicon wafer. FEOL devices 25 such as, for example, transistors and capacitors, are formed on substrate 20. BEOL level 30 includes interconnects and vias for connecting FEOL devices 25 to form integrated circuit 10. It should be noted that although only one BEOL level 30 is shown throughout FIGS. 1–4, one or more BEOL levels 30 can be incorporated into integrated circuit 10. BEOL level 30 includes inter-level dielectric 35, vias 40*a*, 40*c* and interconnect 40*b*. Vias 40*a*, 40*c* and interconnect 40*b* can be formed by processes known in the art such as damascene (i.e. via 40*a*) or dual damascene (i.e. interconnect 40*b* and via 40*c*). Barrier layer 45 comprising a dielectric such as, for example, silicon nitride having a preferred thickness of about 0.02 um to 0.2 um, more preferably from about 0.025 to 0.035 um, is formed on BEOL level 30 and insulator layer 50 comprising a dielectric such as, for example, silicon oxide having a preferred thickness of about 0.2 um to 2.0 um, more preferably from about 0.3 um to 0.4 um, is formed on silicon nitride layer 45.

Vias 40*a*, 40*c* and interconnect 40*b* are formed of a low electrical resistance metal such as, for example, copper. Inter-level dielectric 35 comprises an electrically insulating material such as, for example, a low-k dielectric (i.e. SiLK). The present invention will be described with reference to copper interconnects formed in a SiLK inter-level dielectric. It should be noted, however, that the present invention is not limited to copper interconnects formed in a SiLK inter-level dielectric. As will be described hereinafter, the present invention can be applied to interconnects formed of other metals such as, for example, aluminum, and inter-level dielectrics formed of other insulating materials such as, for example, silicon oxide.

Figure 1B:
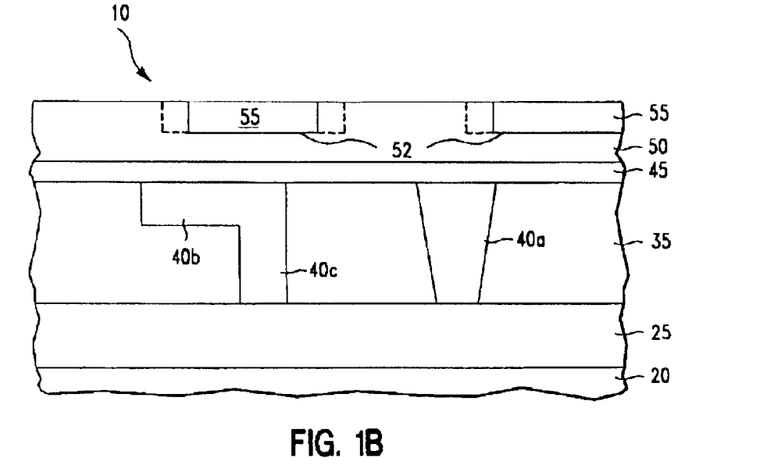

Silicon oxide layer 50 is patterned and etched to form trench 52 as illustrated in FIG. 1B. Trench 52 can be formed to any desired depth up to the thickness of silicon oxide layer 50, a preferred depth being about 0.2 um. A heat transient layer 55 comprising a material having a lower melting point temperature than the melting point temperature of the interconnect (i.e. copper) is formed in trench 52. Heat transient layer 55 can be formed from a material such as, for example, aluminum, lead, and tin. A layer of aluminum is formed by a known process such as, for example, chemical vapor deposition (CVD), sputter deposition or evaporation on silicon oxide layer 50 and fills trench 52. Chemical-mechanical polishing (CMP) is performed to remove aluminum which over-fills trenches 52 resulting in aluminum heat transient layer 55. Aluminum heat transient layer 55 can include a thin liner film (not shown) formed of a material such as, for example, titanium (Ti), titanium nitride (TiN), tantalum (Ta), tantalum nitride TaN) or tungsten (W). It should be understood that although the thin liner film is not shown as a discrete layer in the figures, the thin liner film is included with reference to a respective aluminum heat transient layer.

Figure 1C:
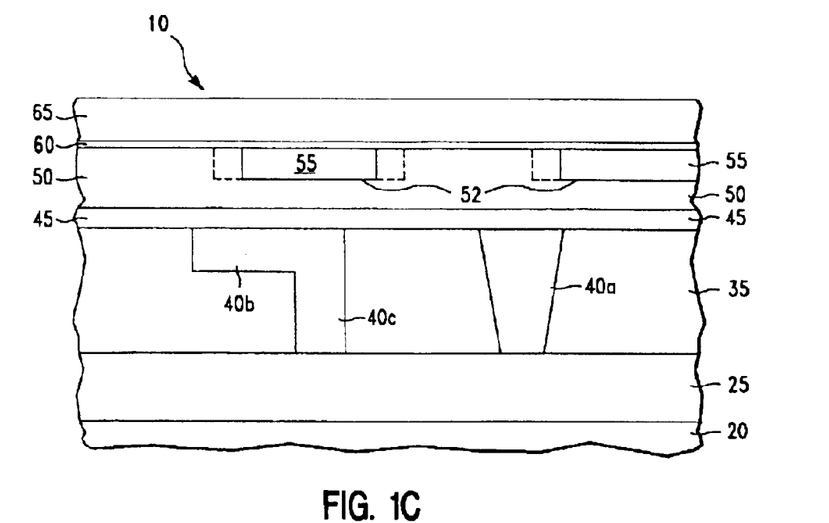
Figure 1D:
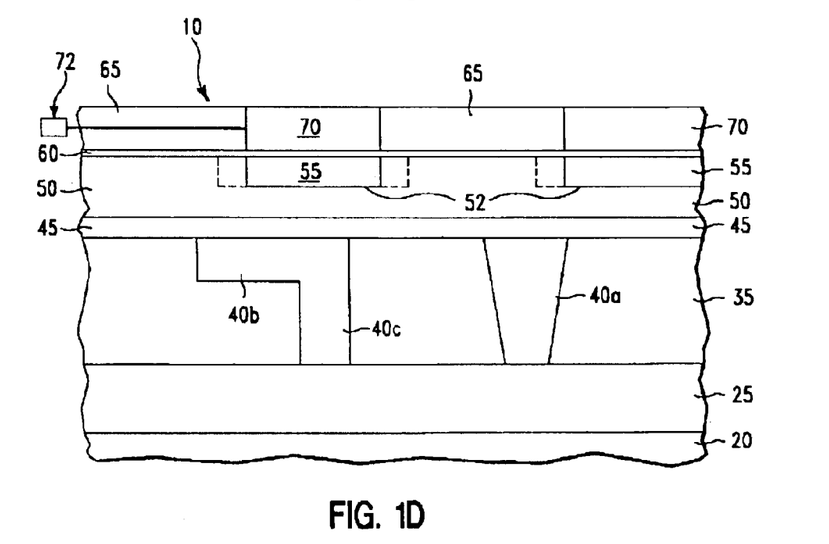

Barrier layer 60 comprising a dielectric such as, for example, silicon nitride having a preferred thickness of about 0.02 um to 0.2 um, more preferably from about 0.025 to 0.035 um, is formed on silicon oxide layer 50 and aluminum heat transient layer 55 as shown in FIG. 1C. Silicon nitride layer 60 electrically isolates aluminum heat transient layer 55 from a subsequently formed copper interconnect. Further, silicon nitride layer 60 prevents a reaction (i.e. chemical reaction) between aluminum heat transient layer 55 and a subsequently formed copper interconnect. Inter-level dielectric layer 65 comprising a low-k dielectric such as, for example, SiLK having a preferred thickness of about 0.2 um to 2.0 um, more preferably from about 0.3 to 0.4 um, is formed on silicon nitride layer 60. Referring to FIG. 1D, copper interconnect 70 is formed in SILK layer 65 by a known process such as a damascene process. Copper interconnect 70 can include a thin liner film such as, for example, tantalum nitride (TaN) (not shown) for preventing corrosion of copper interconnect 70. It should be understood that although the thin liner film is not shown as a discrete layer in the figures, the thin liner film is included with reference to a respective copper interconnect. One or more of copper interconnects 70 can be connected to an input/output pad 72 for providing electrical connection to an external source such as, for example, power, ground, or a signal line.

Figure 1E:
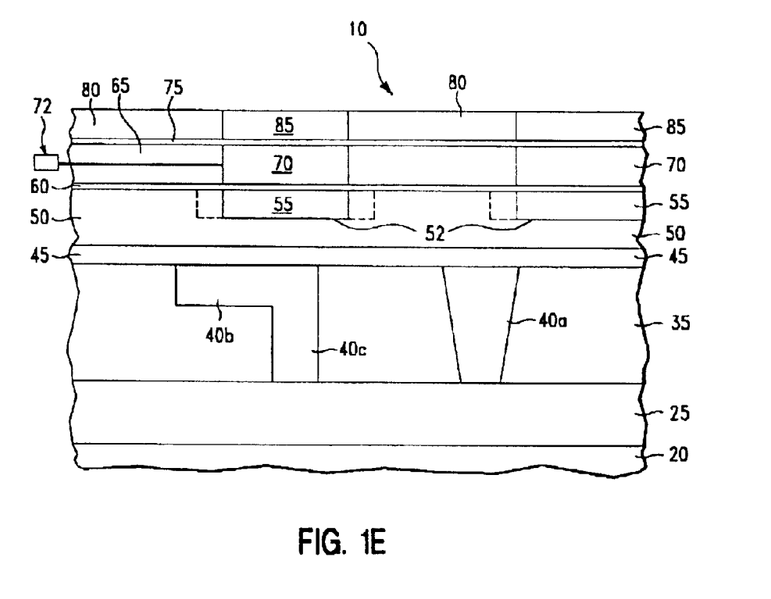

As described herein above, aluminum heat transient layer 55 is formed in close proximity to a lower surface of interconnect 70. Optionally, an additional heat transient layer can be formed in close proximity to an upper surface of copper interconnect 70 as shown in FIG. 1E. Process steps used to form lower heat transient layer 55 are repeated to form upper heat transient layer. Barrier layer 75 (i.e. silicon nitride) having a preferred thickness of about 0.02 um to 0.2 um, more preferably from about 0.025 to 0.035 um, is formed on SiLK layer 65 and copper interconnect 70. Dielectric layer 80 (i.e. silicon oxide) having a preferred thickness of about 0.2 um to 2.0 um, more preferably from about 0.3 to 0.4 um, is formed on silicon nitride layer 75. Heat transient layer 85 comprising aluminum is then formed as was described with reference to aluminum heat transient layer 55. It should be noted that heat transient layer 85 does not have to be the same material as aluminum heat transient layer 55. That is, heat transient layer 85 can be formed from a different material such as, for example, lead or tin.

According to a second embodiment of the present invention, a heat transient layer is formed in close proximity to one or more sides of an interconnect. Although the formation of a heat transient layer in such a manner is effective in thermal dissipation of heat away from the interconnect, it may not provide maximum heat removal since the area of the thermal conduction path between the heat transient layer and the interconnect is determined by the height and length of the interconnect. For an interconnect which has a height that is less than its width (i.e. a thin interconnect), thermal dissipation of heat by a heat transient layer formed in close proximity to a side of the interconnect will be less than that from a heat transient layer formed in close proximity to a lower (or upper) surface of the interconnect. However, design or performance requirements may require the formation of a heat transient layer in close proximity to a side of an interconnect such as in the case where it is not possible to form a heat transient layer in close proximity to a lower or upper surface of the interconnect.

Figure 2A:
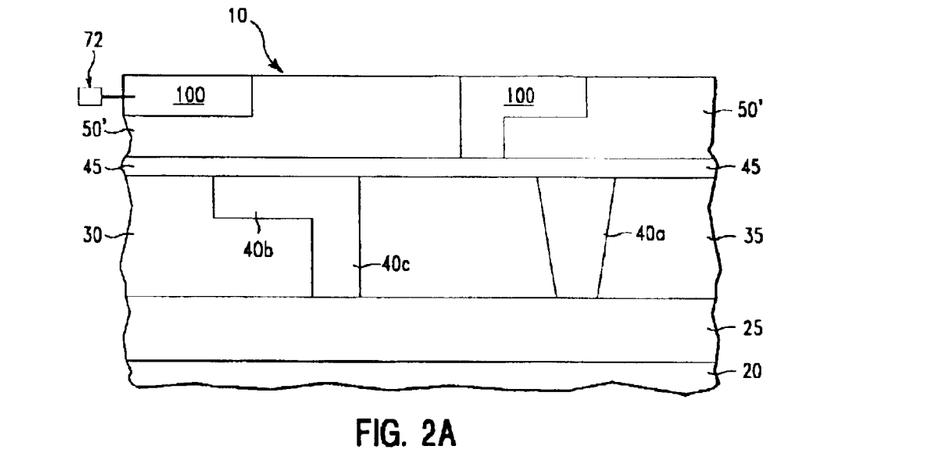
FIGS. 2A–B show the formation of a latent heat of transformation absorber according to a second embodiment of the present invention.
Figure 2B:
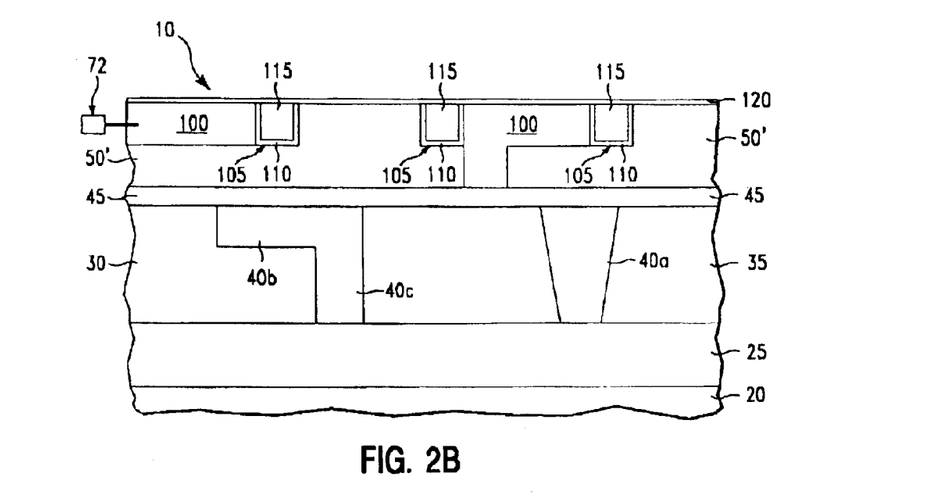

Referring to FIGS. 2A–B, a heat transient layer according to a second embodiment of the present invention will be described. It should be noted that structures shown in FIGS. 2A–B that are the same structures as those described in FIGS. 1A–E are denoted by the same numerals. Referring to FIG. 2A, integrated circuit 10 includes copper interconnect 100 that is formed in inter-level dielectric 50'(i.e. SiLK) having a preferred thickness of about 0.2 um to 2.0 um, more preferably from about 0.3 to 0.4 um, by a known process such as, for example, damascene or dual damascene. One or more of copper interconnects 100 can be connected to an input/output pad 72 for providing electrical connection to an external source such as, for example, power, ground, or a signal line.

Trench 105 is formed adjacent copper interconnect 100 as shown in FIG. 2B. Trench 105 can be formed by patterning and removing SILK layer 50' by known photolithographic and etch (e.g. oxygen reactive ion etch) techniques. Liner 110 comprising a dielectric such as, for example, silicon nitride is formed along exposed surfaces of trench 105. Silicon nitride liner 110 electrically and physically isolates a subsequently formed heat transient layer from an interconnect. Liner 110 can also be formed of an electrically conducting material such as, for example, Ti, TiN, Ta, TaN or W resulting in subsequently formed heat transient layer 115 electrically connected to an interconnect. The main function of liner 110 is to physically isolate heat transient layer 115 and the adjacent interconnect in order to prevent any chemical reaction between aluminum and copper. Heat transient layer 115 comprising aluminum, lead, or tin is then formed in trench 105. Aluminum heat transient layer 115 is formed by depositing (i.e. chemical vapor deposition) a layer of aluminum to fill trench 105 and removing excess aluminum by a process such as, for example, CMP. Barrier layer 120 comprising a dielectric such as, for example, silicon nitride having a preferred thickness of about 0.02 um to 0.2 um, more preferably from about 0.025 to 0.035 um, is formed to encapsulate copper interconnect 100 and aluminum heat transient layer 115.

Although FIG. 2B shows aluminum heat transient layer 115 formed in close proximity to the sides of multiple copper interconnects 100, it should be noted that since trench 105 is defined by a photolithography process, aluminum heat transient layer 115 may be formed adjacent all copper interconnects 100, or formed adjacent one or more selected copper interconnects 100 (i.e. interconnects that are known to require a high rate of heat dissipation). Further, aluminum heat transient layer 115 may be formed adjacent only one side of copper interconnect 100 rather than on both sides as shown in FIG. 2B.

Figure 3:
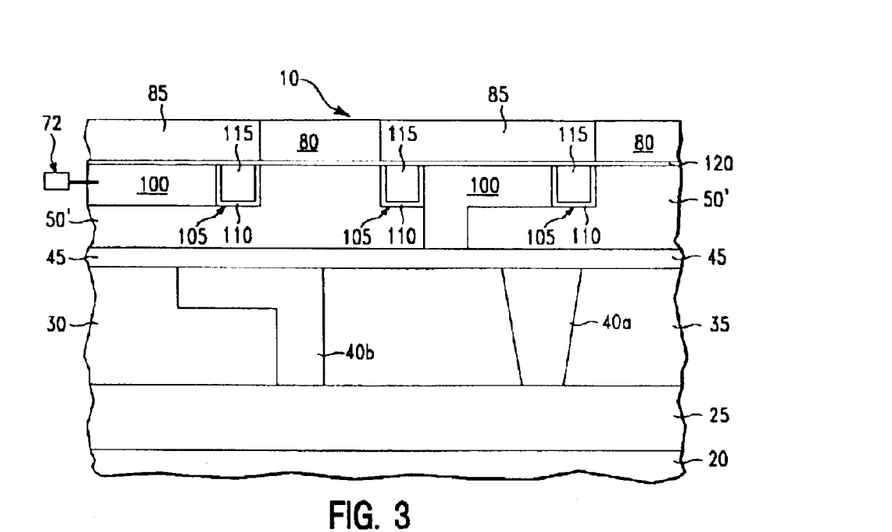
FIG. 3 shows the formation of a latent heat of transformation absorber according to a third embodiment of the present invention.

According to a third embodiment of the present invention, an additional heat transient layer as was described with reference to FIG. 1E can be formed in conjunction with aluminum heat transient layer 115 (see FIG. 2B). Referring to FIG. 3, aluminum heat transient layer 85 is formed in close proximity to an upper surface of copper interconnect 100. Aluminum heat transient layer 85 is formed in silicon oxide layer 80 oxide as was described herein above with reference to FIG. 1E. Heat transient layer 85 can be formed of the same material as heat transient layer 115 (i.e. aluminum) or a different material such as, for example, tin or lead. Heat transient layer 85 provides for additional heat dissipation away from copper interconnect 100.

Figure 4:
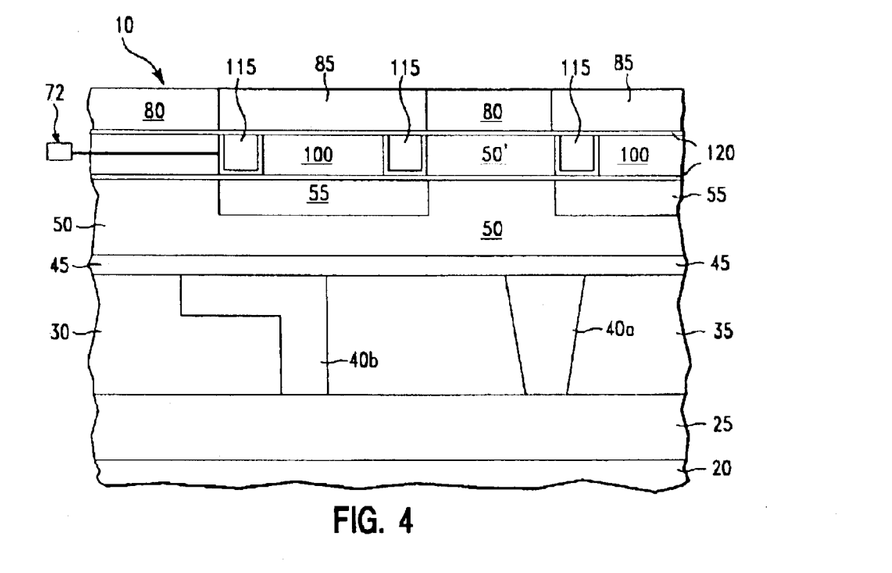
FIG. 4 shows the formation of a latent heat of transformation absorber according to a fourth embodiment of the present invention.

According to a fourth embodiment of the present invention, a copper interconnect is surrounded by multiple heat transient layers as shown in FIG. 4. By forming aluminum heat transient layers 55, 115 and 85 as described herein above with reference to FIGS. 1D, 2C, and 1E, respectively, copper interconnect 100 can be surrounded to provide a significantly increased amount of heat dissipation. It should be noted that each of heat transient layers 55, 115 and 85 can be formed of the same or different materials. For example, heat transient layers 55 and 85 can be formed of the same material such as aluminum while heat transient layer 115 can be formed of a different material such as tin or lead.

Although various configurations of heat transient layers have been described with reference to FIGS. 1–4, the present invention also encompasses additional configurations such as, for example, forming a heat transient layer adjacent an upper surface of an interconnect (i.e. heat transient layer 85 shown in FIG. 1E) without forming a heat transient layer adjacent a lower surface of the interconnect. Likewise, heat transient layer can be formed having various widths, lengths and heights according to design and heat dissipation requirements for a given interconnect.

An interconnect which is connected to an input/output pad is especially exposed to high electric currents from sources such as, for example, an ESD event. An ESD event can result in, for example, an electric current of about at least 100 mA for a short time duration pulse of about 1×10E-9 seconds (e.g. nanoseconds) being generated from an external source (i.e. static charge from a human being) that is transmitted via the input/out pad to the respective interconnect within the integrated circuit. The high current pulse from such an ESD event results in a large amount of heat being generated in the interconnect which must be dissipated away from the interconnect in order to avoid detrimental effects such as melting of the interconnect.

The heat transient layer of the present invention significantly enhances the dissipation of heat away from an interconnect such that a high current pulse from an ESD event can be withstood so that the occurrence of detrimental effects such as melting of the interconnect can be reduced. The heat transient layer is selected to have a melting point temperature which is below the melting point temperature of the interconnect. As the local temperature generated by current flow through the interconnect exceeds the melting point temperature of the heat transient layer, the heat transient layer undergoes an endothermic phase change from a solid to a liquid. Therefore, as the heat transient layer undergoes the phase change from solid to liquid, additional heat can be absorbed away from the interconnect by the heat transient layer without an increase in temperature of the heat transient layer. The present invention takes advantage of the latent heat of transformation required to convert a solid to a liquid. Once the melting point temperature of the solid heat transient layer is achieved, the melting point temperature is maintained as additional heat that is absorbed is used to convert the solid heat transient layer to a liquid heat transient layer. It should be noted that the phase change is a fully-reversible reaction so that the heat transient layer returns to a solid once the local temperature decreases below the melting point temperature of the heat transient layer. The additional heat that can be absorbed during the solid to liquid phase change of the heat transient layer provides increased protection of a copper interconnect especially, for example, during an ESD event since higher currents can be withstood by the copper interconnect.

The present invention also provides for heat transient layers associated with an interconnect to be customized (see FIGS. 1–4) to further enhance heat dissipation. For example, an interconnect that is known to be susceptible to high current can be surrounded by multiple heat transient layers as shown in FIG. 4. The heat transient layer also dissipates heat away from an adjacent interconnect by solid phase thermal conduction. That is, heat generated by the interconnect creates a local temperature that is below the melting point temperature of the heat transient layer so the heat transient layer remains in the solid phase while dissipating heat away from the interconnect.

Figure 5A:
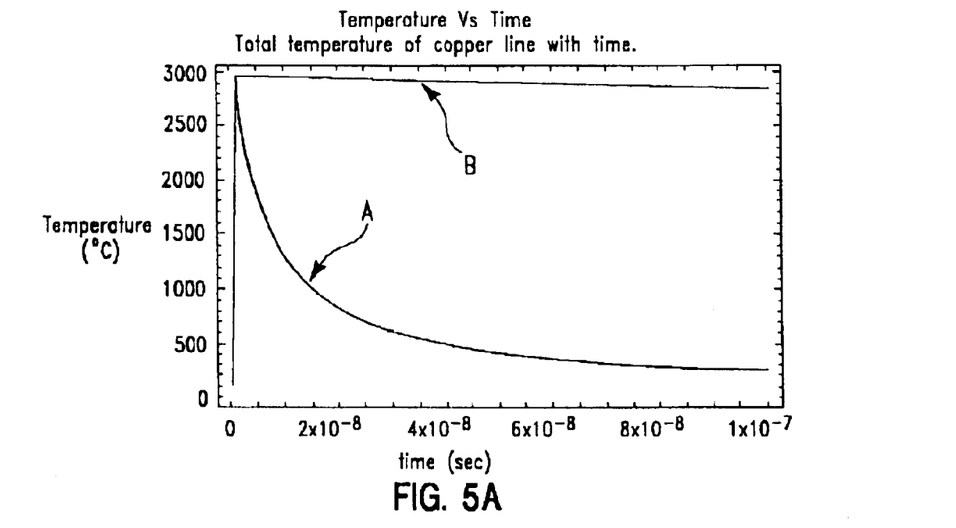
FIGS. 5A–B are graphs illustrating heat dissipation from an interconnect according to the present invention.
Figure 5B:
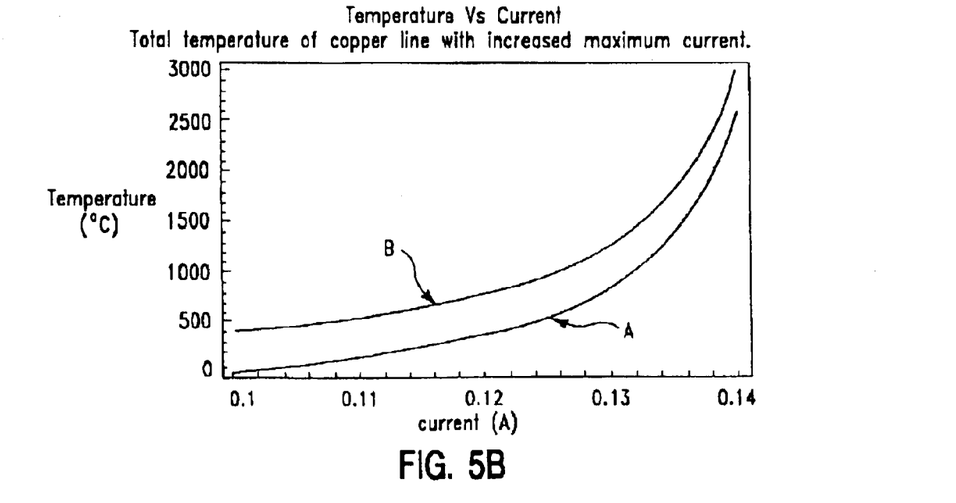

The advantages of a heat transient layer integrated into the BEOL metallurgy of an integrated circuit can be calculated by using a model where heat is dissipated away from a copper interconnect by aluminum heat transient layers adjacent an upper and lower surface of the copper interconnect (see FIG. 1E). The aluminum heat transient layers are modeled as having the same height, width, and length as the copper interconnect. Referring to FIG. 5A, curve A represents the temperature of a copper interconnect associated with the aluminum heat transient layers. Curve B represents the temperature of a copper interconnect with no aluminum heat transient layer. FIG. 5A shows the relatively rapid heat dissipation away from the copper interconnect achieved in the presence of aluminum heat transient layers for a given electrical current. FIG. 5B shows the increase in copper interconnect temperature due to power input. Curve A represents the temperature of a copper interconnect with aluminum heat transfer layers adjacent upper and lower surfaces of the copper interconnect (see FIG. 1E). Curve B represents the temperature of a copper interconnect with no aluminum heat transient layer. Use of heat transient layers adjacent to upper and lower surfaces of a copper interconnect allow for increased current flow in the copper interconnect for a given temperature compared to a copper interconnect without a heat transient layer.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto. For example, heat transient layer can be connected to other non-electrical thermal conducting structures such as, for example, a heat sink in order to further enhance heat dissipation from an interconnect. Also, an interconnect can be formed of other metals such as a refractory metal, for example, tungsten, and the corresponding heat transient layer formed of another metal such as copper, where copper has a lower melting point temperature than refractory metals so that copper would undergo a solid to liquid phase transformation at a temperature below the melting point temperature of the refractory metal. The invention can also take advantage of other latent heat of transformation phase changes such as, for example, a latent heat of transformation of heat transient layer to a gaseous phase.

What is claimed is:

1. An integrated circuit apparatus comprising:
   a plurality of integrated circuit devices;
   conductive interconnection metallurgy interconnecting said integrated circuit devices;
   a plurality of input/output pads electrically connected to said conductive interconnection metallurgy, said input/output pads subject to electrostatic discharge events; and
   at least one latent heat of transformation absorber associated with at least one of said input/output pads for preventing the energy generated by an electrostatic discharge event from damaging said conductive interconnection metallurgy.

2. The integrated circuit apparatus of claim 1, wherein said at least one latent heat of transformation absorber comprises a heat transient material having a melting point temperature lower than a melting point temperature of the conductive interconnection metallurgy.

3. The integrated circuit apparatus of claim 2, wherein said heat transient material undergoes a phase transformation from a solid to a liquid.

4. The integrated circuit apparatus of claim 3, wherein said heat transient material comprises a metal.

5. The integrated circuit apparatus of claim 4, wherein said metal comprises a material which is selected from the group consisting of aluminum, tin, lead, and alloys thereof.

6. The integrated circuit apparatus of claim 4, wherein said heat transient material comprises a first layer formed adjacent a first surface of conductive interconnection metallurgy associated with said at least one of said input/output pads.

7. The integrated circuit apparatus of claim 6, wherein said heat transient material comprises a second layer formed adjacent a second surface opposite the first surface of conductive interconnection metallurgy associated with said at least one of said input/output pads.

8. The integrated circuit apparatus of claim 4, wherein said conductive interconnection metallurgy associated with said at least one of said input/output pads is surrounded by said heat transient material.

9. The integrated circuit apparatus of claim 1, wherein the conductive interconnection metallurgy comprises copper.

10. The integrated circuit apparatus of claim 9, wherein said conductive interconnection metallurgy is formed in a low thermal conductivity dielectric.

11. The integrated circuit apparatus of claim 10, wherein the low thermal conductivity dielectric comprises a low-k dielectric.

12. The integrated circuit apparatus of claim 11, wherein the low-k dielectric comprises SiLK.

13. Method of forming an integrated circuit apparatus comprising the steps of:
   providing a plurality of integrated circuit devices on a substrate;
   forming conductive interconnection metallurgy interconnecting said integrated circuit devices;
   forming a plurality of input/output pads electrically connected to said conductive interconnection metallurgy, said input/output pads subject to electrostatic discharge events; and
   forming at least one latent heat of transformation absorber associated with at least one of said input/output pads for preventing the energy generated by an electrostatic discharge event from damaging said conductive interconnection metallurgy.

14. The method claim 13, wherein said at least one latent heat of transformation absorber comprises a heat transient material having a melting point temperature lower than a melting point temperature of the conductive interconnection metallurgy.

15. The method of claim 14, wherein said heat transient material undergoes a phase transformation from a solid to a liquid.

16. The method of claim 15, wherein said heat transient material comprises a metal.

17. The method of claim 16, wherein said metal comprises a material which is selected from the group consisting of aluminum, tin, lead, and alloys thereof.

18. The method of claim 16, wherein said step of forming said heat transient material comprises forming a first layer adjacent a first surface of conductive interconnection metallurgy associated with said at least one of said input/output pads.

19. The method of claim 18, wherein said step of forming said heat transient material further comprises forming a second layer adjacent a second surface opposite the first surface of conductive interconnection metallurgy associated with said at least one of said input/output pads.

20. The method of claim 16, wherein said conductive interconnection metallurgy associated with said at least one of said input/output pads is surrounded by said heat transient material.

21. The method of claim 13, wherein the conductive interconnection metallurgy comprises copper.

22. The method of claim 21, wherein said conductive interconnection metallurgy is formed in a low thermal conductivity dielectric.

23. The method of claim 22, wherein the low thermal conductivity dielectric comprises a low-k dielectric.

24. The method of claim 23, wherein the low-k dielectric comprises SiLK.

* * * * *